United States Patent
Stein et al.

(10) Patent No.: US 8,322,045 B2
(45) Date of Patent: Dec. 4, 2012

(54) SINGLE WAFER APPARATUS FOR DRYING SEMICONDUCTOR SUBSTRATES USING AN INERT GAS AIR-KNIFE

(75) Inventors: Nathan D. Stein, Mountain View, CA (US); Younes Achkire, Los Gatos, CA (US); Timothy J. Franklin, Campbell, CA (US); Julia Svirchevski, San Jose, CA (US); Dan A. Marohl, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 512 days.

(21) Appl. No.: 12/249,956

(22) Filed: Oct. 12, 2008

(65) Prior Publication Data
US 2009/0044839 A1    Feb. 19, 2009

Related U.S. Application Data

(62) Division of application No. 10/461,889, filed on Jun. 13, 2003, now abandoned.

(60) Provisional application No. 60/388,277, filed on Jun. 13, 2002.

(51) Int. Cl.
*F26B 21/06*    (2006.01)

(52) U.S. Cl. ............. 34/77; 34/78; 34/80; 34/82; 34/84; 34/107; 34/168; 34/201; 34/210; 134/30; 134/95.2; 427/377

(58) Field of Classification Search ................ 34/77, 78, 34/80, 82, 84, 107, 168, 201, 210; 427/377; 134/30, 95.2
See application file for complete search history.

(56) References Cited

U.S. PATENT DOCUMENTS

| | | | | |
|---|---|---|---|---|
| 3,337,966 | A | * | 8/1967 | Meeussen et al. ............... 34/250 |
| 3,579,853 | A | | 5/1971 | Martino |
| 3,579,289 | A | | 8/1971 | Soignet et al. |
| 3,611,986 | A | * | 10/1971 | Pierson ........................... 118/63 |
| 3,767,300 | A | | 10/1973 | Brown et al. |
| 3,871,326 | A | | 3/1975 | Kanda et al. |
| 3,928,064 | A | * | 12/1975 | Holm ............................... 134/6 |
| 4,114,563 | A | * | 9/1978 | Schnedler et al. ............... 118/63 |
| 4,336,279 | A | | 6/1982 | Metzger |
| 4,353,981 | A | * | 10/1982 | Noda et al. .................... 430/536 |
| 4,388,258 | A | * | 6/1983 | Hungerford ................... 264/129 |

(Continued)

FOREIGN PATENT DOCUMENTS

EP    519698 A2    12/1992

(Continued)

OTHER PUBLICATIONS

Web-cleaner products of Web Systems Inc., downloaded from http://www.web-cleaner-co.com/ on Jun. 3, 2004.

(Continued)

*Primary Examiner* — Stephen M. Gravini
(74) *Attorney, Agent, or Firm* — Dugan & Dugan, PC

(57) ABSTRACT

In one aspect, a substrate processing apparatus is provided. The apparatus comprises a mechanism for forming a meniscus on a surface of a substrate by moving the substrate through a fluid; an air knife apparatus positioned to apply an air knife to shorten the meniscus formed on the surface of the substrate; and a drying vapor nozzle positioned to direct a drying vapor to the meniscus shortened by the air knife. Numerous other aspects are provided.

20 Claims, 4 Drawing Sheets

U.S. PATENT DOCUMENTS

| | | | |
|---|---|---|---|
| 4,457,254 A * | 7/1984 | Hungerford | 118/34 |
| 4,536,458 A * | 8/1985 | Ng | 430/41 |
| 4,541,568 A | 9/1985 | Lichfield | |
| 4,611,409 A | 9/1986 | Minami et al. | |
| 4,646,446 A | 3/1987 | Bubley | |
| 4,751,957 A * | 6/1988 | Vaught | 164/463 |
| 4,781,764 A | 11/1988 | Leenaars | |
| 4,783,947 A | 11/1988 | Posey et al. | |
| 4,788,992 A * | 12/1988 | Swainbank et al. | 134/64 R |
| 4,937,163 A * | 6/1990 | Tam et al. | 430/41 |
| 4,984,597 A | 1/1991 | McConnell et al. | |
| 5,005,250 A | 4/1991 | Trautmann et al. | |
| 5,055,138 A | 10/1991 | Slinn | |
| 5,077,353 A * | 12/1991 | Culbertson | 525/446 |
| 5,097,755 A | 3/1992 | Hill | |
| 5,183,067 A | 2/1993 | Slinn | |
| 5,212,012 A * | 5/1993 | Culbertson | 428/336 |
| 5,212,260 A * | 5/1993 | Culbertson | 525/446 |
| 5,243,768 A | 9/1993 | Fukao et al. | |
| 5,298,325 A * | 3/1994 | Culbertson | 428/336 |
| 5,308,687 A * | 5/1994 | Melpolder et al. | 428/411.1 |
| 5,333,628 A | 8/1994 | Ogata et al. | |
| 5,335,681 A | 8/1994 | Schmid | |
| 5,339,842 A | 8/1994 | Bok | |
| 5,350,601 A * | 9/1994 | Culbertson et al. | 427/412.1 |
| 5,351,419 A | 10/1994 | Franka et al. | |
| 5,371,950 A | 12/1994 | Schumacher | |
| 5,392,843 A * | 2/1995 | Dolan | 164/485 |
| 5,412,411 A | 5/1995 | Anderson | |
| 5,419,021 A | 5/1995 | Seroogy | |
| 5,424,120 A * | 6/1995 | Culbertson | 428/336 |
| 5,432,539 A | 7/1995 | Anderson | |
| 5,437,733 A | 8/1995 | Okumura | |
| 5,440,821 A | 8/1995 | Hamrin | |
| 5,447,566 A | 9/1995 | Loiacono | |
| 5,496,647 A * | 3/1996 | Krejci et al. | 428/480 |
| 5,520,744 A | 5/1996 | Fujikawa et al. | |
| 5,545,713 A * | 8/1996 | Krejci et al. | 528/295 |
| 5,562,997 A * | 10/1996 | Krejci et al. | 428/480 |
| 5,569,330 A | 10/1996 | Schild et al. | |
| 5,571,337 A | 11/1996 | Mohindra et al. | |
| 5,591,294 A * | 1/1997 | Sakaki et al. | 156/250 |
| 5,607,777 A * | 3/1997 | Krejci et al. | 428/480 |
| 5,634,978 A | 6/1997 | Mohindra et al. | |
| 5,651,412 A | 7/1997 | Williams et al. | |
| 5,660,642 A | 8/1997 | Britten | |
| 5,732,478 A | 3/1998 | Chapman et al. | |
| 5,734,945 A | 3/1998 | Earle et al. | |
| 5,793,390 A | 8/1998 | Claflin et al. | |
| 5,795,649 A * | 8/1998 | Cosentino et al. | 428/336 |
| 5,807,439 A | 9/1998 | Akatsu et al. | |
| 5,836,084 A | 11/1998 | Jackson et al. | |
| 5,843,627 A | 12/1998 | Nok | |
| 5,882,433 A | 3/1999 | Ueno | |
| 5,884,141 A | 3/1999 | Inoue et al. | |
| 5,884,640 A | 3/1999 | Fishkin et al. | |
| 5,934,299 A | 8/1999 | Akatsu | |
| 5,951,779 A | 9/1999 | Koyanagi et al. | |
| 5,952,106 A * | 9/1999 | Schriver et al. | 428/423.5 |
| 5,964,958 A | 10/1999 | Ferrell et al. | |
| 5,989,359 A | 11/1999 | Berbel | |
| 6,017,584 A * | 1/2000 | Albert et al. | 427/213.3 |
| 6,027,574 A | 2/2000 | Fishkin et al. | |
| 6,041,796 A | 3/2000 | Berbel | |
| 6,043,162 A | 3/2000 | Shimizu et al. | |
| 6,054,327 A | 4/2000 | Bensimon et al. | |
| 6,067,185 A * | 5/2000 | Albert et al. | 359/296 |
| 6,108,932 A | 8/2000 | Chai | |
| 6,120,839 A * | 9/2000 | Comiskey et al. | 427/213.3 |
| 6,120,868 A * | 9/2000 | Heberger et al. | 428/41.4 |
| 6,128,829 A | 10/2000 | Wolke et al. | |
| 6,128,830 A | 10/2000 | Bettcher et al. | |
| 6,139,645 A | 10/2000 | Leenaars et al. | |
| 6,153,075 A * | 11/2000 | Nemelka | 204/485 |
| 5,807,522 A | 12/2000 | Asada et al. | |
| 6,158,141 A * | 12/2000 | Asada et al. | 34/74 |
| 6,169,556 B1 | 1/2001 | Koitabashi et al. | |
| 6,199,301 B1 | 3/2001 | Wallace | |
| 6,224,701 B1 | 5/2001 | Bryant et al. | |
| 6,228,216 B1 | 5/2001 | Lindsay et al. | |
| 6,244,701 B1 * | 6/2001 | Moriya et al. | 347/105 |
| 6,247,481 B1 * | 6/2001 | Meuris et al. | 134/133 |
| 6,249,271 B1 * | 6/2001 | Albert et al. | 345/107 |
| 6,261,377 B1 * | 7/2001 | Mertens et al. | 134/6 |
| 6,262,706 B1 * | 7/2001 | Albert et al. | 345/107 |
| 6,262,833 B1 | 7/2001 | Loxley et al. | 359/296 |
| 6,265,074 B1 * | 7/2001 | Shah et al. | 428/413 |
| 6,269,511 B1 | 8/2001 | Andreas et al. | |
| 6,273,100 B1 | 8/2001 | Andreas et al. | |
| 6,277,203 B1 | 8/2001 | Jiang et al. | |
| 6,282,812 B1 | 9/2001 | Wee et al. | |
| 6,289,605 B1 | 9/2001 | Chang | |
| 6,300,932 B1 * | 10/2001 | Albert | 345/107 |
| 6,312,971 B1 * | 11/2001 | Amundson et al. | 438/99 |
| 6,319,330 B1 | 11/2001 | Jiang et al. | |
| 6,322,860 B1 * | 11/2001 | Stein et al. | 428/1.26 |
| 6,328,809 B1 | 12/2001 | Elsawy et al. | |
| 6,328,814 B1 | 12/2001 | Fishkin et al. | |
| 6,329,268 B1 | 12/2001 | Nakamori et al. | |
| 6,334,902 B1 * | 1/2002 | Mertens et al. | 134/1 |
| 6,350,322 B1 | 2/2002 | Yates | |
| 6,368,480 B1 | 4/2002 | Nemelka | 204/485 |
| 6,376,067 B1 * | 4/2002 | Heberger et al. | 428/336 |
| 6,377,387 B1 * | 4/2002 | Duthaler et al. | 359/296 |
| 6,392,785 B1 * | 5/2002 | Albert et al. | 359/296 |
| 6,392,786 B1 * | 5/2002 | Albert | 359/296 |
| 6,398,875 B1 | 6/2002 | Cotte et al. | |
| 6,410,436 B2 | 6/2002 | Yamagata et al. | |
| 6,418,640 B1 | 7/2002 | Fukuda et al. | |
| 6,421,932 B2 | 7/2002 | Gommori et al. | |
| 6,455,142 B1 * | 9/2002 | Heberger et al. | 428/215 |
| 6,461,442 B1 * | 10/2002 | Bush et al. | 134/8 |
| 6,491,764 B2 * | 12/2002 | Mertens et al. | 134/36 |
| 6,500,523 B1 * | 12/2002 | Hirose et al. | 428/32.21 |
| 6,502,327 B2 | 1/2003 | Kume et al. | |
| 6,515,649 B1 * | 2/2003 | Albert et al. | 345/107 |
| 6,530,385 B2 * | 3/2003 | Meuris et al. | 134/25.4 |
| 6,533,872 B1 | 3/2003 | Leenaars et al. | |
| 6,555,017 B1 | 4/2003 | Rushford et al. | |
| 6,568,408 B2 * | 5/2003 | Mertens et al. | 134/95.2 |
| 6,589,361 B2 | 7/2003 | Luscher et al. | |
| 6,591,518 B2 | 7/2003 | Barberi | |
| 6,601,595 B2 | 8/2003 | Yates | |
| 6,607,001 B1 | 8/2003 | Yates | |
| 6,607,823 B2 * | 8/2003 | Posey et al. | 428/336 |
| 6,613,430 B2 * | 9/2003 | Culbertson et al. | 428/352 |
| 6,625,901 B1 | 9/2003 | Mehmandoust et al. | |
| 6,632,751 B2 | 10/2003 | Mertens et al. | |
| 6,635,500 B2 | 10/2003 | Lewis | |
| 6,641,677 B1 | 11/2003 | Yates | |
| 6,645,311 B2 | 11/2003 | Yates | |
| 6,645,615 B2 * | 11/2003 | Heberger et al. | 428/336 |
| 6,655,042 B2 | 12/2003 | Yi et al. | |
| 6,656,289 B2 | 12/2003 | Yates | |
| 6,656,574 B1 * | 12/2003 | Nemelka | 428/207 |
| 6,663,956 B2 * | 12/2003 | Heberger et al. | 428/332 |
| 6,676,754 B1 * | 1/2004 | Fleming et al. | 118/325 |
| 6,676,765 B2 * | 1/2004 | Mertens et al. | 134/6 |
| 6,681,499 B2 | 1/2004 | Scranton et al. | |
| 6,684,523 B2 | 2/2004 | Bailey et al. | |
| 6,695,926 B1 | 2/2004 | Koyanagi et al. | |
| 6,709,735 B2 * | 3/2004 | Posey et al. | 428/215 |
| 6,721,083 B2 * | 4/2004 | Jacobson et al. | 359/296 |
| 6,727,881 B1 * | 4/2004 | Albert et al. | 345/107 |
| 6,729,040 B2 | 5/2004 | Mehmandoust et al. | |
| 6,740,194 B2 | 5/2004 | Rushford et al. | |
| 6,742,285 B2 | 6/2004 | Shepard | |
| 6,746,544 B2 | 6/2004 | Fishkin et al. | |
| 6,754,980 B2 * | 6/2004 | Lauerhaas et al. | 34/594 |
| 6,757,989 B2 | 7/2004 | Bae et al. | |
| 6,780,327 B1 * | 8/2004 | Wu et al. | 210/660 |
| 6,783,937 B1 * | 8/2004 | Hou et al. | 435/6 |
| 6,784,106 B2 | 8/2004 | Bae et al. | |
| 6,797,074 B2 | 9/2004 | Redeker et al. | |
| 6,799,588 B1 * | 10/2004 | Speh et al. | 134/64 R |
| 6,811,839 B2 * | 11/2004 | Hiro et al. | 428/32.3 |
| 6,818,114 B2 * | 11/2004 | Nemelka | 204/485 |

| Patent No. | Kind | Date | Inventor | Ref |
|---|---|---|---|---|
| 6,821,349 | B2* | 11/2004 | Mertens et al. | 134/2 |
| 6,822,782 | B2* | 11/2004 | Pratt et al. | 359/296 |
| 6,831,769 | B2* | 12/2004 | Holman et al. | 359/296 |
| 6,842,996 | B2 | 1/2005 | Szarka | |
| 6,851,435 | B2 | 2/2005 | Mertens et al. | |
| 6,851,561 | B2* | 2/2005 | Wu et al. | 210/490 |
| 6,860,393 | B2* | 3/2005 | Hou et al. | 210/435 |
| 6,870,661 | B2* | 3/2005 | Pullen et al. | 359/296 |
| 6,875,289 | B2 | 4/2005 | Christenson et al. | |
| 6,883,248 | B2 | 4/2005 | Ko et al. | |
| 6,896,740 | B2 | 5/2005 | Yates | |
| 6,898,867 | B1 | 5/2005 | VanderPyl | |
| 6,899,111 | B2 | 5/2005 | Luscher et al. | |
| 6,911,255 | B2* | 6/2005 | Posey et al. | 428/336 |
| 6,928,751 | B2* | 8/2005 | Hosack et al. | 34/594 |
| 6,954,993 | B1 | 10/2005 | Smith et al. | |
| 6,982,178 | B2* | 1/2006 | LeCain et al. | 438/22 |
| 6,987,603 | B2* | 1/2006 | Paolini et al. | 359/296 |
| 6,988,326 | B2 | 1/2006 | O'Donnell et al. | |
| 6,988,327 | B2 | 1/2006 | Garcia et al. | |
| 6,990,751 | B2 | 1/2006 | Riley et al. | |
| 7,000,622 | B2 | 2/2006 | Woods et al. | |
| 7,002,728 | B2* | 2/2006 | Pullen et al. | 359/296 |
| 7,003,899 | B1 | 2/2006 | Garcia et al. | |
| 7,045,018 | B2 | 5/2006 | Ravkin et al. | |
| 7,069,937 | B2 | 7/2006 | Garcia et al. | |
| 7,071,913 | B2* | 7/2006 | Albert et al. | 345/107 |
| 7,093,375 | B2 | 8/2006 | O'donnell | |
| 7,094,347 | B2* | 8/2006 | Wu et al. | 210/321.84 |
| 7,100,304 | B2* | 9/2006 | Lauerhaas et al. | 34/312 |
| 7,109,968 | B2* | 9/2006 | Albert et al. | 345/107 |
| 7,110,163 | B2* | 9/2006 | Webber et al. | 359/296 |
| 7,110,164 | B2* | 9/2006 | Paolini et al. | 359/296 |
| 7,119,759 | B2* | 10/2006 | Zehner et al. | 345/1.1 |
| 7,122,126 | B1 | 10/2006 | Fuentes | |
| 7,127,831 | B2 | 10/2006 | Garcia et al. | |
| 7,132,049 | B2* | 11/2006 | Hou et al. | 210/500.35 |
| 7,143,527 | B2 | 12/2006 | Garcia et al. | |
| 7,153,400 | B2 | 12/2006 | Ravkin et al. | |
| 7,163,019 | B2 | 1/2007 | Yates | |
| 7,170,190 | B1 | 1/2007 | Treur et al. | |
| 7,198,055 | B2 | 4/2007 | Woods et al. | |
| 7,204,889 | B2 | 4/2007 | Yates | |
| 7,206,119 | B2* | 4/2007 | Honeyman et al. | 359/296 |
| 7,223,341 | B2* | 5/2007 | Wu et al. | 210/500.37 |
| 7,224,433 | B2 | 5/2007 | Mertens et al. | |
| 7,225,044 | B2* | 5/2007 | Hiatt et al. | 700/119 |
| 7,230,750 | B2* | 6/2007 | Whitesides et al. | 359/296 |
| 7,231,682 | B1 | 6/2007 | Boyd et al. | |
| 7,234,477 | B2 | 6/2007 | de Larios et al. | |
| 7,236,292 | B2* | 6/2007 | LeCain et al. | 359/296 |
| 7,238,085 | B2 | 7/2007 | Montierth et al. | |
| 7,239,932 | B2* | 7/2007 | Farnworth | 700/118 |
| 7,239,933 | B2* | 7/2007 | Hiatt et al. | 700/118 |
| 7,240,679 | B2 | 7/2007 | Woods et al. | |
| 7,247,379 | B2* | 7/2007 | Pullen et al. | 428/407 |
| 7,252,098 | B2 | 8/2007 | Fishkin et al. | |
| 7,254,900 | B2 | 8/2007 | Parks | |
| 7,256,864 | B2* | 8/2007 | Kate et al. | 355/30 |
| 7,264,007 | B2 | 9/2007 | Boyd et al. | |
| 7,293,571 | B2 | 11/2007 | Woods et al. | |
| 7,314,907 | B2* | 1/2008 | Dong et al. | 528/480 |
| 7,339,715 | B2* | 3/2008 | Webber et al. | 359/296 |
| 7,350,315 | B2 | 4/2008 | Davis et al. | |
| 7,350,316 | B2 | 4/2008 | Woods et al. | |
| 7,352,434 | B2* | 4/2008 | Streefkerk et al. | 355/53 |
| 7,353,560 | B2 | 4/2008 | Boyd et al. | |
| 7,354,990 | B2* | 4/2008 | Hossan et al. | 528/480 |
| 7,363,727 | B2 | 4/2008 | O'Donnell | |
| 7,367,345 | B1 | 5/2008 | Hemker et al. | |
| 7,375,875 | B2* | 5/2008 | Whitesides et al. | 359/296 |
| 7,383,843 | B2 | 6/2008 | Ravkin et al. | |
| 7,387,689 | B2 | 6/2008 | de Larios et al. | |
| 7,389,689 | B2* | 6/2008 | Wargo et al. | 73/432.1 |
| 7,389,783 | B2 | 6/2008 | Woods et al. | |
| 7,391,555 | B2* | 6/2008 | Albert et al. | 359/296 |
| 7,395,611 | B2 | 7/2008 | Garcia et al. | |
| 7,396,465 | B2* | 7/2008 | Wu et al. | 210/500.21 |
| 7,396,569 | B2* | 7/2008 | Lalli et al. | 427/409 |
| 7,411,719 | B2* | 8/2008 | Paolini et al. | 359/296 |
| 7,411,720 | B2 | 8/2008 | Honeyman et al. | 359/296 |
| 7,416,370 | B2 | 8/2008 | de Larios et al. | |
| 7,422,639 | B2 | 9/2008 | Yates | |
| 7,429,537 | B2 | 9/2008 | Augerter et al. | |
| 7,441,299 | B2 | 10/2008 | de Larios et al. | |
| 7,443,571 | B2* | 10/2008 | LeCain et al. | 359/296 |
| 7,455,787 | B2* | 11/2008 | Rose et al. | 216/24 |
| 7,464,719 | B2 | 12/2008 | Garcia et al. | |
| 7,468,779 | B2* | 12/2008 | De Graaf et al. | 355/53 |
| 7,513,062 | B2 | 4/2009 | Achkire et al. | |
| 7,513,262 | B2 | 4/2009 | Woods | |
| 7,513,813 | B2* | 4/2009 | Paolini et al. | 445/23 |
| 7,518,288 | B2 | 4/2009 | Bran | |
| 7,527,698 | B2 | 5/2009 | Holsteyns et al. | |
| 7,532,388 | B2* | 5/2009 | Whitesides et al. | 359/296 |
| 7,535,624 | B2* | 5/2009 | Amundson et al. | 359/296 |
| 7,554,712 | B2* | 6/2009 | Patry et al. | 359/254 |
| 7,561,324 | B2* | 7/2009 | Duthaler et al. | 359/296 |
| 7,583,427 | B2* | 9/2009 | Danner et al. | 359/254 |
| 7,585,935 | B2* | 9/2009 | Hossan et al. | 528/480 |
| 7,602,470 | B2* | 10/2009 | Kemper et al. | 355/30 |
| 2001/0015021 | A1 | 8/2001 | Gommori et al. | |
| 2001/0047595 | A1 | 12/2001 | Mehmandoust | |
| 2002/0029490 | A1 | 3/2002 | Lundquist | |
| 2002/0053515 | A1 | 5/2002 | Nemelka | 204/485 |
| 2002/0058758 | A1* | 5/2002 | Culbertson et al. | 525/191 |
| 2002/0066204 | A1 | 6/2002 | Barberi | |
| 2002/0089735 | A1* | 7/2002 | Albert et al. | 359/296 |
| 2002/0097309 | A1 | 7/2002 | Hiro | 347/101 |
| 2002/0114890 | A1* | 8/2002 | Posey et al. | 427/385.5 |
| 2002/0121289 | A1 | 9/2002 | Brown et al. | |
| 2002/0121290 | A1 | 9/2002 | Tang et al. | |
| 2002/0122935 | A1* | 9/2002 | Heberger et al. | 428/336 |
| 2002/0152636 | A1 | 10/2002 | Ernst et al. | |
| 2002/0171910 | A1* | 11/2002 | Pullen et al. | 359/296 |
| 2002/0185378 | A1* | 12/2002 | Honeyman et al. | 204/601 |
| 2002/0187340 | A1* | 12/2002 | Posey et al. | 428/336 |
| 2002/0189643 | A1 | 12/2002 | Chen et al. | |
| 2003/0025855 | A1* | 2/2003 | Holman et al. | 349/86 |
| 2003/0035947 | A1* | 2/2003 | Heberger et al. | 428/336 |
| 2003/0037457 | A1 | 2/2003 | Bailey et al. | |
| 2003/0041879 | A1 | 3/2003 | Redeker et al. | |
| 2003/0061725 | A1 | 4/2003 | Riley et al. | |
| 2003/0096113 | A1* | 5/2003 | Jacobson et al. | 428/379 |
| 2003/0101616 | A1 | 6/2003 | Scranton et al. | |
| 2003/0106239 | A1* | 6/2003 | Yi et al. | 34/444 |
| 2003/0112491 | A1* | 6/2003 | Albert et al. | 359/296 |
| 2003/0118730 | A1 | 6/2003 | Aouad et al. | |
| 2003/0121170 | A1 | 7/2003 | Achkire et al. | |
| 2003/0121173 | A1 | 7/2003 | Bae et al. | |
| 2003/0124365 | A1* | 7/2003 | Posey et al. | 428/480 |
| 2003/0172547 | A1 | 9/2003 | Shephard | |
| 2004/0018345 | A1* | 1/2004 | Athorn-Telep et al. | 428/195.1 |
| 2004/0027327 | A1* | 2/2004 | LeCain et al. | 345/107 |
| 2004/0031167 | A1* | 2/2004 | Stein et al. | 34/443 |
| 2004/0060195 | A1 | 4/2004 | Garcia et al. | |
| 2004/0074102 | A1* | 4/2004 | Lin | 34/78 |
| 2004/0115354 | A1 | 6/2004 | Filippou et al. | |
| 2004/0131934 | A1* | 7/2004 | Sugnaux et al. | 429/209 |
| 2004/0148048 | A1* | 7/2004 | Farnworth | 700/119 |
| 2004/0153193 | A1* | 8/2004 | Farnworth | 700/120 |
| 2004/0155857 | A1* | 8/2004 | Duthaler et al. | 345/107 |
| 2004/0158343 | A1* | 8/2004 | Hiatt et al. | 700/118 |
| 2004/0159340 | A1* | 8/2004 | Hiatt et al. | 134/26 |
| 2004/0159344 | A1* | 8/2004 | Hiatt et al. | 134/110 |
| 2004/0159967 | A1* | 8/2004 | Farnworth | 264/71 |
| 2004/0164461 | A1* | 8/2004 | Ahmad et al. | 264/401 |
| 2004/0167663 | A1* | 8/2004 | Hiatt et al. | 700/213 |
| 2004/0186608 | A1* | 9/2004 | Hiatt et al. | 700/120 |
| 2004/0200409 | A1 | 10/2004 | Svirchevski | |
| 2004/0221473 | A1 | 11/2004 | Lauerhaas et al. | |
| 2004/0226820 | A1 | 11/2004 | Webber et al. | 204/471 |
| 2004/0231188 | A1 | 11/2004 | Lauerhaas et al. | |
| 2004/0251193 | A1* | 12/2004 | Wu et al. | 210/321.86 |
| 2004/0252360 | A1* | 12/2004 | Webber et al. | 359/296 |
| 2004/0257635 | A1* | 12/2004 | Paolini et al. | 359/296 |
| 2004/0262216 | A1* | 12/2004 | Hou et al. | 210/490 |
| 2005/0000813 | A1* | 1/2005 | Pullen et al. | 204/601 |

| | | | |
|---|---|---|---|
| 2005/0003737 A1 | 1/2005 | Montierth et al. | |
| 2005/0018273 A1* | 1/2005 | Honeyman et al. | 359/296 |
| 2005/0022418 A1 | 2/2005 | Rietmann | |
| 2005/0022861 A1* | 2/2005 | Rose et al. | 136/256 |
| 2005/0035941 A1* | 2/2005 | Albert et al. | 345/107 |
| 2005/0049751 A1* | 3/2005 | Farnworth | 700/259 |
| 2005/0064129 A1* | 3/2005 | Dong et al. | 428/64.2 |
| 2005/0064204 A1* | 3/2005 | Lalli et al. | 428/428 |
| 2005/0079291 A1* | 4/2005 | Fyen et al. | 427/346 |
| 2005/0105159 A1* | 5/2005 | Paolini et al. | 359/252 |
| 2005/0122564 A1* | 6/2005 | Zehner et al. | 359/296 |
| 2005/0132515 A1 | 6/2005 | Boyd et al. | |
| 2005/0139537 A1* | 6/2005 | Hou et al. | 210/321.62 |
| 2005/0146774 A1* | 7/2005 | LeCain et al. | 359/296 |
| 2005/0152022 A1* | 7/2005 | Honeyman et al. | 359/296 |
| 2005/0168799 A1* | 8/2005 | Whitesides et al. | 359/296 |
| 2005/0193587 A1 | 9/2005 | Tsai et al. | |
| 2005/0211621 A1* | 9/2005 | Wu et al. | 210/321.86 |
| 2005/0211978 A1* | 9/2005 | Bu et al. | 257/40 |
| 2005/0217135 A1 | 10/2005 | O'Donnell et al. | |
| 2005/0217137 A1 | 10/2005 | Smith et al. | |
| 2005/0223588 A1 | 10/2005 | Hansen | |
| 2005/0229426 A1 | 10/2005 | Achkire et al. | |
| 2005/0248645 A1* | 11/2005 | Jenkins et al. | 347/105 |
| 2005/0250932 A1* | 11/2005 | Hossan et al. | 528/480 |
| 2006/0007527 A1* | 1/2006 | Paolini et al. | 359/296 |
| 2006/0016029 A1 | 1/2006 | Mikhaylichenko et al. | |
| 2006/0019034 A1* | 1/2006 | Toyoda | 427/322 |
| 2006/0024437 A1* | 2/2006 | Pullen et al. | 427/216 |
| 2006/0043154 A1* | 3/2006 | Kirby et al. | 228/37 |
| 2006/0064895 A1 | 3/2006 | Garcia et al. | |
| 2006/0150435 A1 | 7/2006 | Garcia et al. | |
| 2006/0226579 A1* | 10/2006 | Farnworth | 264/442 |
| 2006/0238721 A1* | 10/2006 | Kate et al. | 353/53 |
| 2006/0245038 A1* | 11/2006 | Albert et al. | 359/296 |
| 2006/0248745 A1 | 11/2006 | Viswanath et al. | |
| 2006/0249445 A1* | 11/2006 | Wu et al. | 210/500.27 |
| 2006/0254078 A1 | 11/2006 | O'Donnell | |
| 2006/0279527 A1* | 12/2006 | Zehner et al. | 345/107 |
| 2006/0291034 A1* | 12/2006 | Patry et al. | 359/296 |
| 2007/0011905 A1 | 1/2007 | Garcia et al. | |
| 2007/0031654 A1* | 2/2007 | Posey | 428/336 |
| 2007/0035808 A1* | 2/2007 | Amundson et al. | 359/296 |
| 2007/0075628 A1* | 4/2007 | Lewis et al. | 313/503 |
| 2007/0109219 A1* | 5/2007 | Whitesides et al. | 345/55 |
| 2007/0128352 A1* | 6/2007 | Honeyman et al. | 427/212 |
| 2007/0148356 A1* | 6/2007 | Russell et al. | 427/384 |
| 2007/0152956 A1* | 7/2007 | Danner et al. | 345/107 |
| 2007/0155640 A1 | 7/2007 | Freer et al. | |
| 2007/0157952 A1* | 7/2007 | Hiatt et al. | 134/33 |
| 2007/0168074 A1* | 7/2007 | Hiatt et al. | 700/119 |
| 2007/0179654 A1* | 8/2007 | Hiatt et al. | 700/118 |
| 2007/0179655 A1* | 8/2007 | Farnworth | 700/118 |
| 2007/0190166 A1* | 8/2007 | Howard et al. | 424/538 |
| 2007/0190329 A1* | 8/2007 | Wargo et al. | 428/411.1 |
| 2007/0196404 A1* | 8/2007 | Howard et al. | 424/402 |
| 2007/0200795 A1* | 8/2007 | Whitesides et al. | 345/55 |
| 2007/0201124 A1* | 8/2007 | Whitesides et al. | 359/296 |
| 2007/0207493 A1* | 9/2007 | Wu et al. | 435/6 |
| 2007/0207560 A1* | 9/2007 | LeCain et al. | 438/22 |
| 2007/0211002 A1* | 9/2007 | Zehner et al. | 345/84 |
| 2007/0211331 A1* | 9/2007 | Danner et al. | 359/296 |
| 2008/0011815 A1* | 1/2008 | Kirby et al. | 228/259 |
| 2008/0023332 A1 | 1/2008 | Webber et al. | 204/510 |
| 2008/0026496 A1 | 1/2008 | Shiang et al. | 438/22 |
| 2008/0041526 A1* | 2/2008 | Pass | 156/345.31 |
| 2008/0043318 A1* | 2/2008 | Whitesides et al. | 359/296 |
| 2008/0054879 A1* | 3/2008 | LeCain et al. | 324/76.11 |
| 2008/0057252 A1* | 3/2008 | Danner et al. | 428/41.8 |
| 2008/0105277 A1 | 5/2008 | Boyd et al. | |
| 2008/0137176 A1* | 6/2008 | Isobe et al. | 359/296 |
| 2008/0146109 A1* | 6/2008 | Howard et al. | 442/181 |
| 2008/0148595 A1 | 6/2008 | de Larios et al. | |
| 2008/0155852 A1 | 7/2008 | Olgado et al. | |
| 2008/0168676 A1 | 7/2008 | Morrison et al. | |
| 2008/0174853 A1* | 7/2008 | Danner et al. | 359/296 |
| 2008/0187753 A1* | 8/2008 | Hossan et al. | 428/402 |
| 2008/0226889 A1* | 9/2008 | Bu et al. | 428/220 |
| 2008/0244925 A1 | 10/2008 | Shin | |
| 2008/0254228 A1* | 10/2008 | Kojima et al. | 427/466 |
| 2008/0254272 A1* | 10/2008 | Danner et al. | 428/220 |
| 2008/0261044 A1* | 10/2008 | Lalli et al. | 428/402 |
| 2008/0264791 A1* | 10/2008 | Paolini et al. | 204/450 |
| 2008/0289088 A1* | 11/2008 | Howard, Jr. | 2/457 |
| 2008/0299384 A1* | 12/2008 | Kim et al. | 428/336 |
| 2008/0299859 A1* | 12/2008 | Paolini et al. | 445/23 |
| 2008/0309350 A1* | 12/2008 | Danner et al. | 324/537 |
| 2008/0316582 A1* | 12/2008 | Danner et al. | 359/296 |
| 2009/0000729 A1* | 1/2009 | Danner et al. | 156/256 |
| 2009/0004442 A1* | 1/2009 | Danner | 428/195.1 |
| 2009/0009852 A1* | 1/2009 | Honeyman et al. | 359/296 |
| 2009/0024019 A1 | 1/2009 | Stein et al. | |
| 2009/0027762 A1* | 1/2009 | Comiskey et al. | 359/296 |
| 2009/0032068 A1* | 2/2009 | Stein et al. | 134/30 |
| 2009/0034057 A1* | 2/2009 | LeCain et al. | 359/296 |
| 2009/0039312 A1* | 2/2009 | Rose et al. | 252/79.2 |
| 2009/0042330 A1* | 2/2009 | Rose et al. | 438/57 |
| 2009/0044839 A1* | 2/2009 | Stein et al. | 134/95.2 |
| 2009/0078292 A1 | 3/2009 | Stein et al. | |
| 2009/0109519 A1* | 4/2009 | Wu et al. | 359/296 |
| 2009/0109522 A1* | 4/2009 | Paolini et al. | 359/296 |
| 2009/0122389 A1* | 5/2009 | Whitesides et al. | 359/296 |
| 2009/0168067 A1* | 7/2009 | LeCain et al. | 356/441 |
| 2009/0206499 A1* | 8/2009 | Whitesides et al. | 264/4.1 |
| 2009/0225397 A1* | 9/2009 | Amundson et al. | 359/296 |
| 2009/0225398 A1* | 9/2009 | Duthaler et al. | 359/296 |
| 2009/0231661 A1* | 9/2009 | Patry et al. | 359/267 |

FOREIGN PATENT DOCUMENTS

| | | | |
|---|---|---|---|
| GB | 2210152 A | 6/1989 |
| JP | 01250959 A | 10/1989 |
| JP | 02089985 A | 3/1990 |
| JP | 03147324 A | 6/1991 |
| JP | 03283429 A2 | 12/1991 |
| JP | 04337637 A2 | 11/1992 |
| JP | 06058666 A | 3/1994 |
| JP | 7028064 A2 | 1/1995 |
| JP | 07261013 A2 | 10/1995 |
| JP | 08236498 A2 | 9/1996 |
| JP | 09162147 A2 | 6/1997 |
| JP | 10177986 A2 | 6/1998 |
| JP | 11040560 A2 | 2/1999 |
| JP | 11204025 A2 | 7/1999 |
| JP | 11354487 A2 | 12/1999 |
| JP | 2000031239 A2 | 1/2000 |
| JP | 2000100774 A2 | 4/2000 |
| JP | 2000105078 A2 | 4/2000 |
| JP | 2000232087 A2 | 8/2000 |
| JP | 2000252254 A2 | 9/2000 |
| JP | 2000266465 A2 | 9/2000 |
| JP | 2000286320 A2 | 10/2000 |
| JP | 2000346549 A2 | 12/2000 |
| JP | 2001050660 A2 | 2/2001 |
| JP | 2001087719 A2 | 4/2001 |
| JP | 2001099569 A2 | 4/2001 |
| JP | 2001135609 A2 | 5/2001 |
| JP | 2001156308 A2 | 6/2001 |
| JP | 2001227868 A2 | 8/2001 |
| JP | 2001255668 A2 | 9/2001 |
| JP | 2001284310 A2 | 10/2001 |
| JP | 2001349671 A2 | 12/2001 |
| JP | 2002022359 A2 | 1/2002 |
| WO | WO 02/32200 A1 | 4/2002 |

OTHER PUBLICATIONS

Sonic Air Systems, Component Specification Sheet, High Velocity 3" S.S. Air knife, downloaded from http://www.sonicairsystems.com/s23a-3ss-air-knife.pdf, on Jun. 3, 2004.

Sonic Air Systems, Component Specification Sheet, Round Tube Airknife, downloaded from, http://www.sonicairsystems.com/ on May 8, 2002.

Sonic Air Systems, Blowers and Air knife drying systems, downloaded from, http://www.sonicairsystems.com/ on May 8, 2002.

Daniel J. Vanderpyl, et al., "Precision Drying Completes Precision Cleaning", Post Cleaning Processes, Reprinted from Precision Cleaning Magazine, Mar. 1995, pp. 1-6.

Bryce S. Richards, et al, "Novel Uses of TiO2 in Crystalline Silicon Solar Cells", Presented at 28th IEEE PVSC, Sep. 15-22, 2000, Anchorage, AK, pp. 1-4.
Paxton Air-Knife Drying Systems, downloaded from, http://www.paxtonproducts.com/air.htm on May 8, 2002.
U.S. Appl. No. 12/249,960, filed on Oct. 12, 2008.
Provisional Patent Application 61/045,596, filed Apr. 16, 2008.
Wafer drying in wet processing, by Juergen Funkhaenel dated Oct. 1, 2004.
Office Action of U.S. Appl. No. 10/461,889 mailed Aug. 13, 2004.
Office Action of U.S. Appl. No. 10/461,889 mailed Oct. 3, 2006.
Office Action of U.S. Appl. No. 10/461,889 mailed Nov. 3, 2006.
Office Action of U.S. Appl. No. 10/461,889 mailed Mar. 7, 2008.
Office Action of U.S. Appl. No. 10/461,889 mailed May 28, 2009.
Final Office Action of U.S. Appl. No. 10/461,889 mailed Apr. 16, 2007.
Final Office Action of U.S. Appl. No. 10/461,889 mailed Nov. 26, 2008.
Feb. 5, 2007 Response to Office Action of U.S. Appl. No. 10/461,889 mailed Nov. 3, 2006.
Notice of Non-Compliant Amendment of U.S. Appl. No. 10/461,889 mailed Feb. 16, 2007.
Mar. 5, 2007 Response to Notice of Non-Compliant Amendment of U.S. Appl. No. 10/461,889 mailed Feb. 16, 2007.
Aug. 16, 2007 Response to Final Office Action of U.S. Appl. No. 10/461,889 mailed Apr. 16, 2007.
Sep. 8, 2008 Response to Office Action of U.S. Appl. No. 10/461,889 mailed Mar. 7, 2008.
Mar. 18, 2009 Response to Final Office Action of U.S. Appl. No. 10/461,889 mailed Nov. 26, 2008.
Office Action of U.S. Appl. No. 12/249,961 mailed May 28, 2009.
Aug. 28, 2009 Response to Office Action of U.S. Appl. No. 12/249,961 mailed May 28, 2009.
Office Action of U.S. Appl. No. 12/249,960 mailed Feb. 23, 2009.
Preliminary Amendment of U.S. Appl. No. 10/461,889 mailed May 24, 2004.
Advisory Action of U.S. Appl. No. 10/461,889 mailed Apr. 8, 2009.
Notice of Abandonment of U.S. Appl. No. 12/249,960 mailed Oct. 20, 2009.
Final Office Action U.S. Appl. No. 12/249,961 Mailed Jun. 25, 2010.
Examiner Interview Summary of U.S. Appl. No. 12/249,961 mailed Jul. 14, 2010.
Notice of Abandonment of U.S. Appl. No. 10/461,889 mailed May 17, 2005.
Decision on Petition of U.S. Appl. No. 10/461,889 mailed Jan. 9, 2006.
Examiner Interview Summary of U.S. Appl. No. 10/461,889 mailed Jan. 11, 2006.
Renewed Petition of U.S. Appl. No. 10/461,889, filed May 19, 2006.
Decision on Petition of U.S. Appl. No. 10/461,889 mailed Jun. 2, 2006.
Renewed Petition of U.S. Appl. No. 10/461,889 filed Jul. 11, 2006.
Decision on Petition of U.S. Appl. No. 10/461,889 mailed Jul. 21, 2006.
Terminal Disclaimer of U.S. Appl. No. 11/398,058, filed in U.S. Appl. No. 10/461,889 on Aug. 16, 2007.
Examiner Interview Summary of U.S. Appl. No. 10/461,889 mailed Apr. 23, 2009.
Applicant Summary of Interview with Examiner of U.S. Appl. No. 10/461,889, filed May 1, 2009.
Examiner Interview Summary of U.S. Appl. No. 12/249,961 mailed Jan. 13, 2010.
Applicant Summary of Interview with Examiner of U.S. Appl. No. 12/249,961, filed Jan. 26, 2010.
Applicant Summary of Interview with Examiner of U.S. Appl. No. 12/249,961, filed Mar. 29, 2010.
Pre-Appeal Conference Decision of U.S. Appl. No. 12/249,961 mailed May 19, 2010.
Applicant Summary of Interview with Examiner of U.S. Appl. No. 12/249,961, filed Jul. 21, 2010.
Notice of Abandonment of U.S. Appl. No. 12/249,961, mailed Jan. 6, 2011.
Final Office Action of U.S. Appl. No. 12/249,961 mailed Nov. 27, 2009.
Notice of Abandonement of U.S. Appl. No. 10/461,889 mailed Dec. 8, 2009.
Jan. 26, 2010 Response to Final Office Action of U.S. Appl. No. 12/249,961 mailed Nov. 27, 2009.
Advisory Action of U.S. Appl. No. 12/249,961 mailed Feb. 16, 2010.
Pre-Appeal Brief Conference Request of U.S. Appl. No. 12/249,961, filed Mar. 29, 2010.

* cited by examiner ness of Marangoni drying, with respect to absence of
SINGLE WAFER APPARATUS FOR DRYING SEMICONDUCTOR SUBSTRATES USING AN INERT GAS AIR-KNIFE This application is a division of, and claims priority to, U.S. Non-Provisional patent application Ser. No. 10/461,889, filed Jun. 13, 2003, and titled, "SINGLE WAFER METHOD AND APPARATUS FOR DRYING SEMICONDUCTOR SUBSTRATES USING AN INERT GAS AIR-KNIFE," which claims priority to U.S. Provisional Patent Application Ser. No. 60/388,277, filed Jun. 13, 2002, and titled, "SINGLE WAFER METHOD AND APPARATUS FOR DRYING SEMICONDUCTOR SUBSTRATES USING AN INERT GAS AIR-KNIFE." Both of these patent applications are hereby incorporated by reference herein in their entirety for all purposes.

FIELD OF THE INVENTION

This invention is concerned with semiconductor manufacturing and is more particularly concerned with techniques for drying a substrate.

BACKGROUND OF THE INVENTION

It is known to process a semiconductor substrate to achieve a dry and low-contamination condition after processing steps such as chemical mechanical polishing (CMP) and scrubbing. It has also been proposed to employ immersion drying to semiconductor substrates using the so-called Marangoni effect. An example of a Marangoni dryer is disclosed in co-pending, commonly-owned U.S. provisional patent application Ser. No. 60/335,335, filed Nov. 2, 2001, entitled "Single Wafer Immersion Dryer and Drying Methods", and which is hereby incorporated herein by reference in its entirety.

In Marangoni drying, a substrate is raised in a vertical orientation from a fluid bath, and an alcohol vapor is delivered to a meniscus that is formed at the substrate/fluid interface. The alcohol vapor reduces the surface tension at the meniscus, thereby creating a "Marangoni" force resulting in a downward liquid flow opposite to the substrate lift direction. As a result, the substrate surface above the meniscus is dried.

Marangoni drying is promising in terms of substrate throughput, absence of water marks, and low contamination levels achieved. However, it would be desirable to achieve comparable results without the inconveniences of delivering and exhausting hazardous alcohol vapor.

SUMMARY OF THE INVENTION

According to an aspect of the invention, a method of drying a substrate is provided. The inventive method includes raising the substrate out of a fluid bath. During the raising step, an air-knife is applied to a meniscus formed at an interface between the substrate and the surface of the bath.

As referred to herein, an air-knife is not limited to using atmospheric air, but rather may use any suitable gas, including, for example, an inert gas such as nitrogen or argon.

In another aspect of the invention, a method of drying a substrate includes (1) setting a gas delivery angle for an air knife used during an immersion-drying process; (2) using the air knife during immersion drying of a hydrophilic substrate; and (3) using the air knife during immersion drying of a hydrophobic substrate. The gas delivery angle is unchanged during immersion drying of both the hydrophilic substrate and hydrophobic substrate.

It has been found that application of an air-knife to a fluid meniscus in conjunction with substrate immersion drying produces low contamination outcomes (e.g., with no water marks formed on hydrophobic substrates), matching the performance of Marangoni drying, with respect to absence of water marks and acceptable throughput, while avoiding the use of alcohol vapor.

In a further aspect, a meniscus of rinsing fluid may be formed on a substrate via a plurality of spray nozzles, rather than via immersion in a bath. For example, a rinsing fluid may be sprayed across the horizontal diameter of a vertically oriented substrate as it leaves a vertically oriented scrubber. An air knife may be applied at the meniscus or upper boundary of the rinsing fluid on the substrate, to thereby dry the substrate.

Other features and aspects of the present invention will become more fully apparent from the following detailed description, the appended claims and the accompanying drawings.

DETAILED DESCRIPTION

Figure 1:
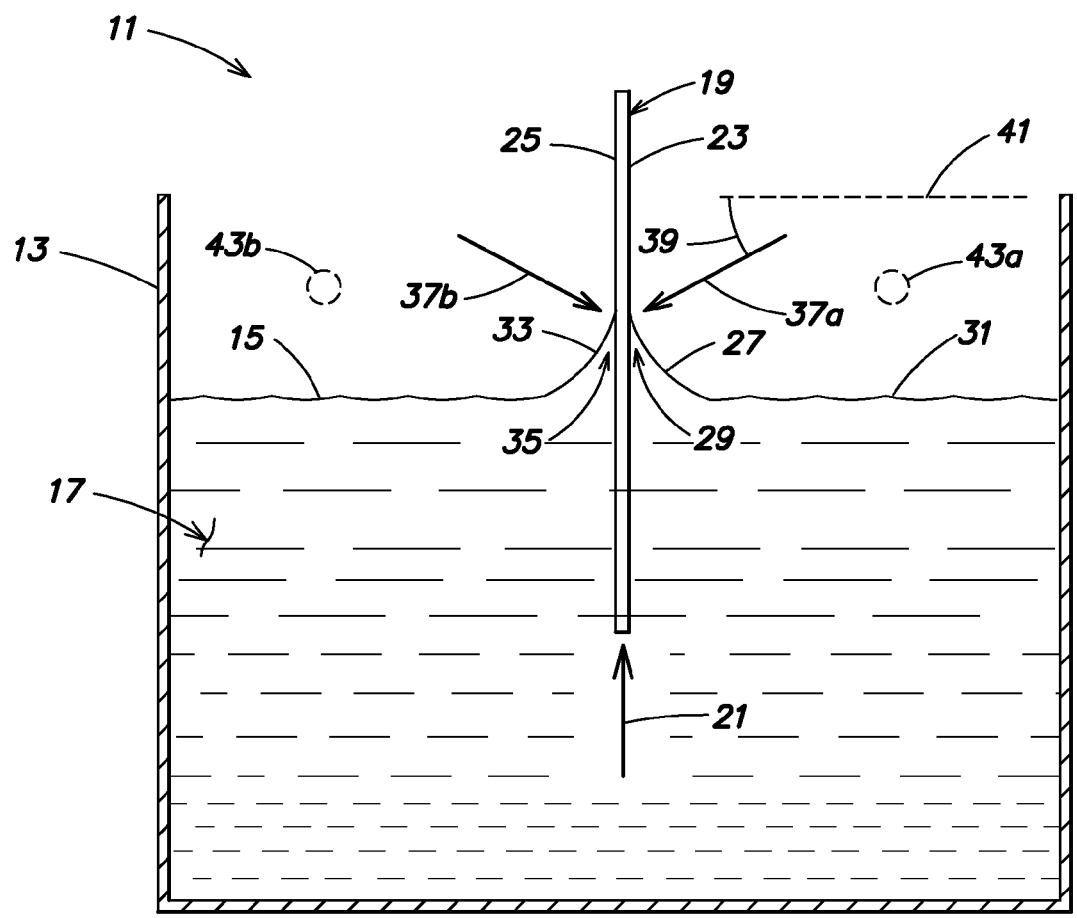
FIG. 1 is a schematic side view illustrating the inventive apparatus and method.

FIG. 1 is a schematic side view of a vertical single wafer immersion drying apparatus 11 configured in accordance with the present invention. For example, the principles of the present invention may be applied to an immersion drying apparatus of the type disclosed in the above-referenced co-pending U.S. provisional patent application Ser. No. 60/335,335, filed Nov. 2, 2001. The inventive immersion drying apparatus 11 includes a tank schematically represented at reference numeral 13. The tank 13 contains a fluid bath 15 constituted by a rinsing fluid 17 such as deionized water, a solution of a corrosion inhibitor such as BTA (benzotriazole) or the like.

A substrate 19 that is being dried in the inventive apparatus 11 is shown being raised in a substantially vertical orientation from the fluid bath 15. The substrate 19 may be, for example, a silicon wafer. A substrate raising mechanism schematically represented by an arrow 21 is provided to raise the substrate 19 from the fluid bath 15.

The substrate 19 has a front side 23 on which one or more material layers have been and/or will be formed. The substrate 19 also has a back side 25 that is opposed to the front side 23. During raising of the substrate 19, a first meniscus 27 of the fluid 17 is formed at an interface 29 between the front side 23 of the substrate 19 and a surface 31 of the fluid 17. A second meniscus 33 is also formed at an interface 35 between the back side 25 of the substrate 19 and the fluid surface 31.

In accordance with the invention, a first air-knife, schematically indicated by an arrow 37a, is applied to the meniscus 27 at the front side 23 of the substrate 19. The first air-knife 37a prevents the fluid 17 at the meniscus 27 from advancing upwardly with the front side 23 of the substrate 19 as the substrate 19 is raised, thereby drying the substrate 19. The first air-knife 37a is applied at an angle 39 which is inclined downwardly from a horizontal plane 41. The angle 39 will be referred to as a "gas delivery angle". The gas delivery angle may, for example, be in the range of 13°-30°, depending on the type of film formed on the substrate 19. Other gas delivery angles may be employed.

As shown, a second air-knife 37b may be applied to the meniscus 33 at the back side 25 of the substrate 19, to aid in drying the back side 25 of the substrate 19. The back side gas delivery angle may, but need not, be different from the front side gas delivery angle. A different gas delivery angle may be preferred for the back side if the surfaces on the two sides have different characteristics. However, it is also contemplated to embody the immersion drying apparatus 11 with an air-knife only at the front side or back side of the substrate.

One advantage of the inventive immersion drying apparatus 11 including an air-knife applied to the fluid meniscus is that the same gas delivery angle 39 may be used in connection with drying both substrates having a hydrophilic film (e.g., TEOS) thereon and also with substrates having a hydrophobic film (e.g., a low k dielectric) thereon. In the absence of the air-knife 37a, the meniscus 27 in the case of the substrate 19 having the hydrophilic film thereon would extend higher above the surface 31 of the fluid 17 than the meniscus formed with a substrate having a hydrophobic film thereon. However, the action of the air-knife 37a shortens or deforms the meniscus formed on the hydrophilic film so that drying may occur at substantially the same point above the fluid surface 31 as in the case of a substrate having a hydrophobic film thereon.

In one embodiment of the invention, the air-knife 37a (or 37b) may be implemented by means of a nozzle 309 (FIGS. 3 and 4), (e.g., a spray tube) of the same type as the gas delivery spray tubes disclosed in the above-referenced co-pending provisional patent application Ser. No. 60/335,335, filed Nov. 2, 2001. Although the nozzle 309 or spray tube may comprise a single linear nozzle, or a plurality of nozzles, they preferably comprise a tube having a line of holes formed therein. In addition, a suitable gas supply (not shown) is coupled to the nozzle. In one embodiment of the invention, the gas employed is nitrogen ($N_2$) although other gases may be used.

In a particular embodiment, a nozzle tube having a perforated length of about 8.5 inches (which may be used, for example, in drying a 200 millimeter wafer) and having 114 holes of 0.005-0.007 inches in diameter, uniformly distributed along the perforated length of the nozzle tube may be used. The holes preferably should all be colinear and have the same orientation. The nozzle tube may be formed of stainless steel, quartz, or another suitable material. Other configurations may be employed.

With such a nozzle tube, a gas flow rate of 15 liters per minute may be employed. Higher or lower gas flow rates could also be employed. For example, gas flow rates in the range of 10-30 liters/minute are specifically contemplated. In one embodiment, a gas delivery angle of 15° was found to be suitable for both hydrophilic and hydrophobic wafer surfaces. It is believed that this angle would also be appropriate for a patterned wafer surface having both hydrophilic and hydrophobic features. Further, it has been found that gas delivery angles in the range of 10°-20° may be preferred for drying a wafer having a hydrophilic film (TEOS).

In the same embodiment, the substrate 19 was raised while being inclined away from the front side air-knife nozzle tube at an angle of 9° from the vertical. The direction of motion of the substrate was in the inclined plane defined by the substrate, as in the immersion tank disclosed in the above-referenced co-pending provisional patent application Ser. No. 60/335,335, filed Nov. 2, 2001.

The cross-sectional center of the nozzle tube was a distance of 0.36 inches above the fluid surface, and at a perpendicular distance from the wafer surface of 0.63 inches for the front-side nozzle. For the back-side nozzle, the perpendicular distance to the wafer was 0.51 inches. In this same embodiment, the speed of raising the substrate was 2.5 millimeters per second. However, satisfactory results have also been obtained with a speed of raising the substrate of 10 millimeters per second. There may be, in general, a trade off between substrate-raising speed and number of contaminants after the drying process, with higher substrate-raising speeds possibly resulting in a greater number of contaminants.

Figure 2:
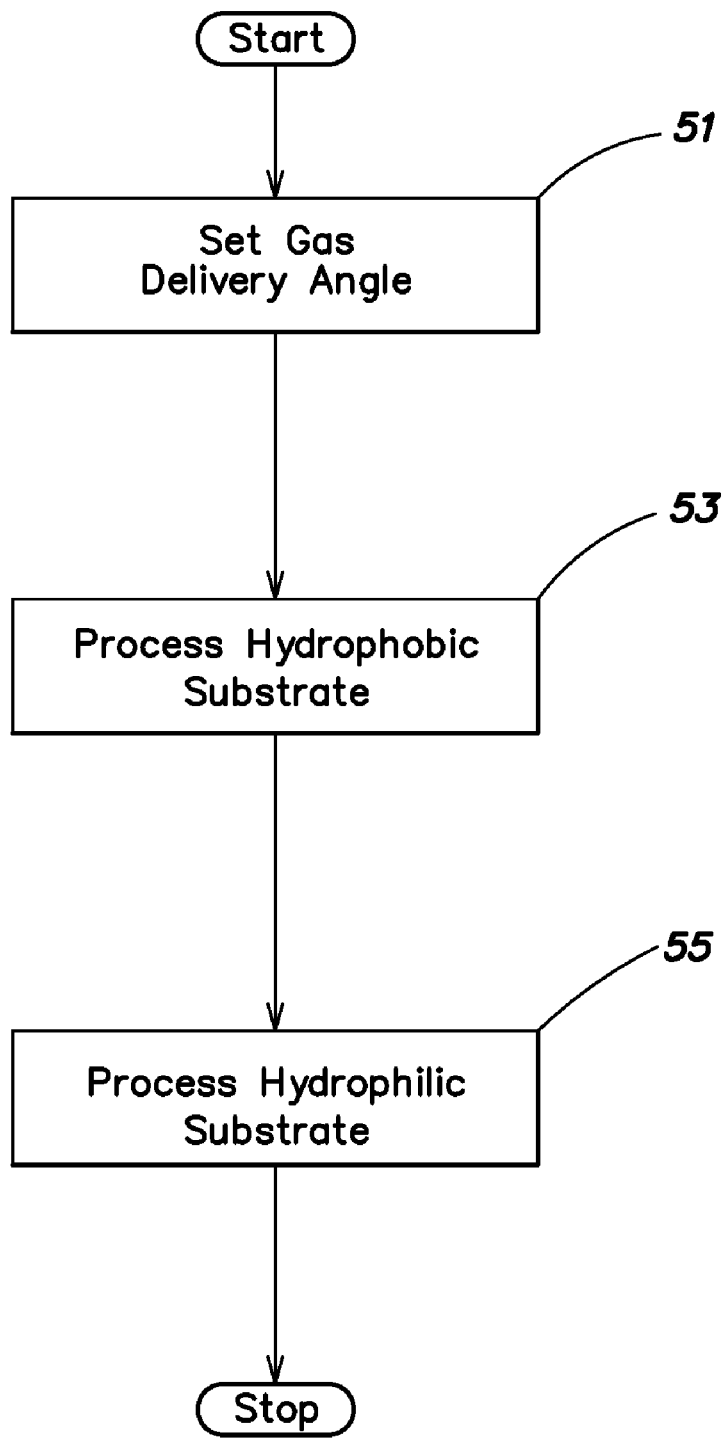
FIG. 2 is a flow chart that illustrates a method of operating the apparatus of FIG. 1.

FIG. 2 is a flow chart that illustrates a method of operating the apparatus of FIG. 1. Initially, in step 51, the gas delivery angle is set (e.g., at 15°). The setting of the gas delivery angle may be performed, for example, by fixedly mounting an air knife 37a and/or 37b (e.g., one or more nozzle tubes) relative to the tank 13. Alternatively, each nozzle tube may be adjustably mounted relative to the tank 13 and may be manually or otherwise adjusted to set the gas delivery angle.

Next, at step 53, one or more hydrophobic substrates (i.e., substrates having a hydrophobic film on the front side thereof) are immersion-dried using an air-knife in accordance with the invention, with the gas delivery angle set at step 51.

Following step 53 is step 55, at which one or more hydrophilic substrates (i.e., substrates having a hydrophilic film on the front side thereof) are immersion-dried using an air-knife in accordance with the invention, with the gas delivery angle set at step 51.

It will be noted that the gas delivery angle is not changed between steps 53 and 55.

The order of steps 53 and 55 may be reversed, and again it is not necessary to change the gas delivery angle between the two steps.

The air-knife may be implemented using structure that is different from the nozzle tube described above. Gas flow rate may be varied and/or a gas other than nitrogen ($N_2$) may be employed.

The present invention may be applied to drying a substrate having a different size and/or a different shape than a 200 mm wafer (e.g., a square or rectangular glass substrate such as employed for flat panel displays). The length of the nozzle tube may be varied as appropriate.

The substrate may be raised at an angle other than 9° from the vertical, or may be raised without inclination (i.e., at 90° from the horizontal).

The air-knife/nozzle tube may be arranged so that the gas delivery angle is adjustable by, e.g., manual adjustment.

An alcohol vapor (e.g., isopropyl alcohol vapor) or another gas or vapor that serves to lower the surface tension of the rinsing fluid (i.e., a Marangoni drying gas) may be included in the gas dispensed by the air-knife nozzle tube (e.g., by the type of arrangement disclosed in the above-referenced co-pending provisional patent application Ser. No. 60/335,335, filed Nov. 2, 2001) so that Marangoni effect drying is also employed in the inventive immersion drying apparatus. Alternatively, a separate Marangoni drying nozzle 43a, 43b (shown in phantom in FIG. 1) may be employed to supply Marangoni drying gas to a meniscus. The Marangoni drying nozzle 43a, 43b may be employed in addition to the air-knife 37a, 37b that manipulates the meniscus. By employing both an air-knife and a Marangoni drying gas, consecutive drying of hydrophilic and hydrophobic surfaces (or vice versa) may be employed without needing to adjust the position of the Marangoni drying nozzle 43a, 43b. Specifically, because the air-knife 37a, 37b manipulates the meniscus 27, 33 to the same position for both hydrophilic and hydrophobic surfaces, the Marangoni drying nozzle 43a, 43b may maintain the same position for drying of hydrophilic surfaces and hydrophobic surfaces. Accordingly, throughput may be increased and labor costs decreased.

Moreover, with use of the present invention (with or without application of a Marangoni drying gas) surfaces having both hydrophilic and hydrophobic portions (such as patterned semiconductor wafers) may be dried with better results (e.g., fewer contaminants).

Figure 3:
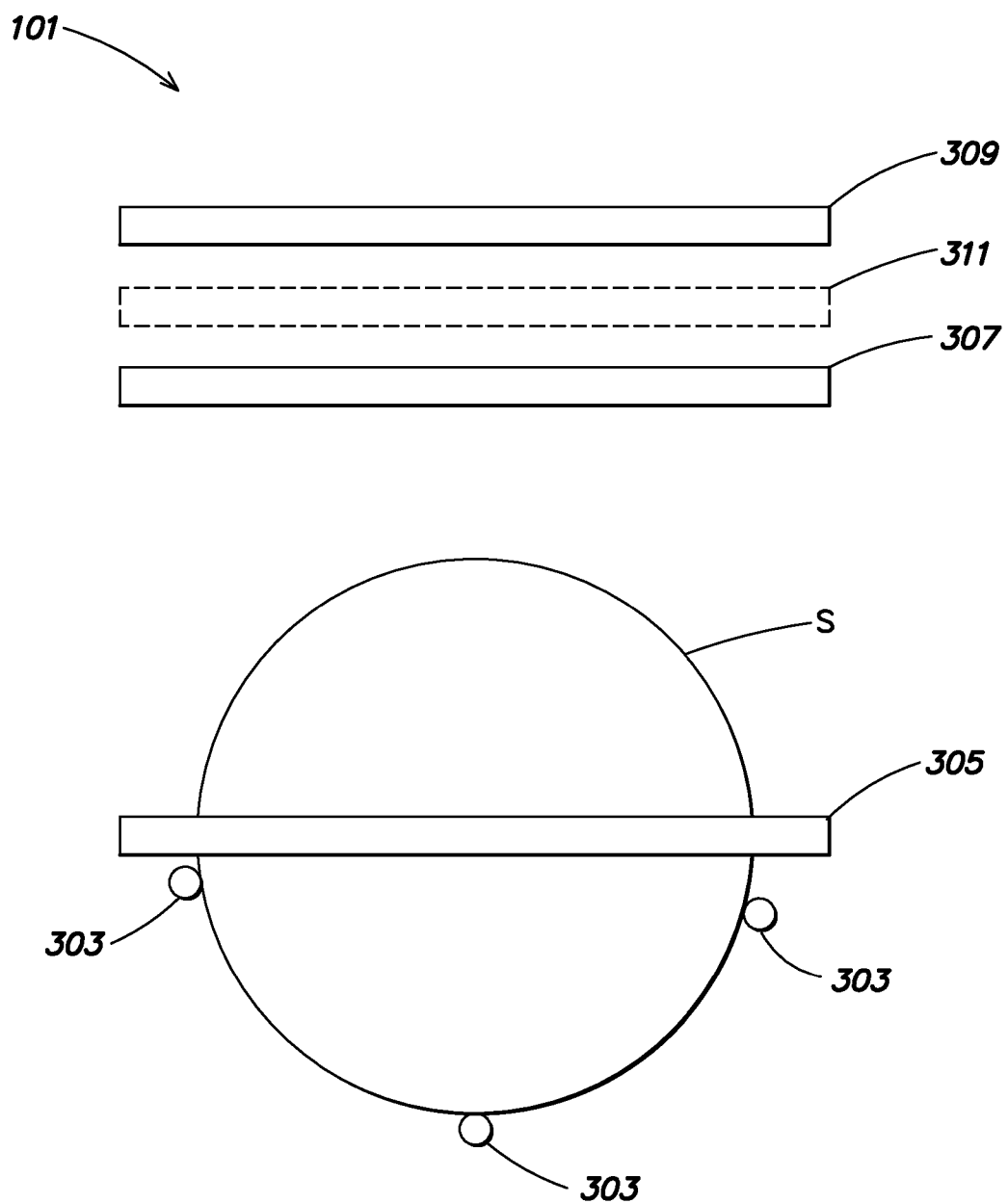
FIG. 3 is a schematic front elevational view of a scrubber that may employ an air knife.
Figure 4:
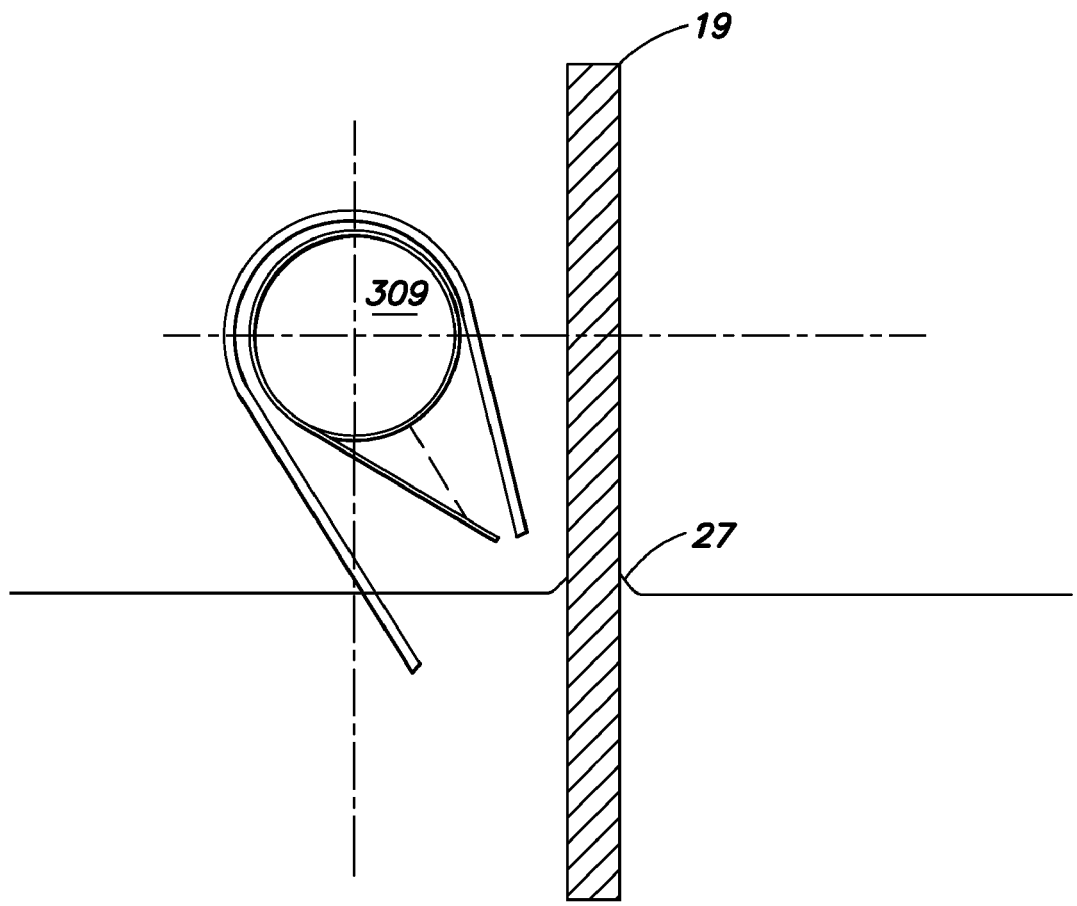
FIG. 4 is a schematic side view illustrating an air knife nozzle in accordance with the present invention.

In a further aspect, the invention may be employed within a vertically oriented scrubber. FIG. 3 is a schematic front elevational view of a vertically oriented scrubber 101, having a plurality of rollers 303 for supporting a substrate S. A front side and a back side scrubber brush 305 (only one shown) are positioned above the rollers 303 so as to contact the front and back sides of the substrate S positioned on the rollers 303. A fluid spray nozzle 307 is positioned above the scrubber brushes 305, and an air knife nozzle 309 is positioned above the fluid spray nozzle 307. An optional Marangoni drying nozzle 311 (shown in phantom) may be included. After the substrate S is scrubbed it may be dried via the air knife nozzle 309 (with or without the aid of a Marangoni drying vapor supplied either via the air knife nozzle 309 or via the Marangoni drying nozzle 311) in the manner described above with reference to FIGS. 1 and 2, as the substrate S is lifted from the rollers 303 (e.g., via a wafer handler or substrate pusher, not shown). Note that the rinsing fluid nozzle 307, the Marangoni drying nozzle 311 and the air knife nozzle 309 preferably are positioned above the upper perimeter of the substrate S when the substrate S is positioned on the rollers 303. In this manner the entire substrate surface is lifted past the nozzles 307-311. A second set of nozzles 307-311 may be similarly positioned along the back side of the substrate S.

The foregoing description discloses only exemplary embodiments of the invention. Modifications of the above disclosed apparatus and method which fall within the scope of the invention will be readily apparent to those of ordinary skill in the art. For instance, a substrate may be held at any orientation while being dried by an air knife. As stated, the present invention may be employed, for example, within a system similar to that described in previously incorporated U.S. Provisional Patent Application Ser. No. 60/335,335, filed Nov. 2, 2001, entitled "Single Wafer Immersion Dryer and Drying Methods" or within any other suitable system.

Accordingly, while the present invention has been disclosed in connection with exemplary embodiments thereof, it should be understood that other embodiments may fall within the spirit and scope of the invention, as defined by the following claims.

The invention claimed is:

1. A substrate processing apparatus, comprising:
a mechanism for forming a meniscus on a surface of a substrate by moving the substrate through a fluid;
an air knife apparatus positioned to apply an air knife to shorten the meniscus formed on the surface of the substrate, wherein the air knife apparatus includes a plurality of perforations adapted to apply the air knife; and
a drying vapor nozzle positioned to direct a drying vapor to the meniscus shortened by the air knife.

2. The apparatus of claim 1 wherein the drying vapor comprises a Marangoni drying gas.

3. The apparatus of claim 1 wherein the mechanism for forming a meniscus comprises a mechanism for lifting a substrate from a fluid bath.

4. The apparatus of claim 1 wherein the mechanism for forming a meniscus comprises a mechanism for moving a substrate through a fluid spray.

5. The apparatus of claim 4 further comprising a fluid spray nozzle adapted to supply the fluid spray.

6. The apparatus of claim 1 wherein the air knife is positioned at an angle of about 13° to 30° from horizontal.

7. The apparatus of claim 1 wherein the air knife is positioned at an angle of about 10° to 20° from horizontal.

8. The apparatus of claim 1 wherein the air knife is positioned at an angle of about 15° from horizontal.

9. The apparatus of claim 1 wherein the perforations are uniformly distributed along the length of the air knife.

10. The apparatus of claim 1 wherein the perforations are colinear.

11. The apparatus of claim 1 wherein the perforations have the same orientation as each other.

12. The apparatus of claim 1 wherein the air knife is adapted to shorten the meniscus such that the meniscus is in the same position for a substrate having at least one of a hydrophilic film and a hydrophobic film.

13. The apparatus of claim 12 wherein the drying vapor nozzle is adapted to maintain the same position for directing the drying vapor at the substrate having at least one of the hydrophilic film and the hydrophobic film.

14. The apparatus of claim 5 wherein the air knife nozzle is positioned above the fluid spray nozzle.

15. The apparatus of claim 1 wherein a first meniscus is formed at an interface between a first side of the substrate and the surface of the fluid.

16. The apparatus of claim 15 wherein a second meniscus is formed at an interface between a second side of the substrate and the surface of the fluid.

17. The apparatus of claim 16 wherein the first side of the substrate includes a hydrophilic film and the second side of the substrate includes a hydrophobic film.

18. The apparatus of claim 17 further comprising a first and a second air knife, wherein the first air knife is adapted to apply a first air knife to the first side of the substrate and the second air knife is adapted to apply a second air knife to the second side of the substrate.

19. The apparatus of claim 18 wherein the first and second air knives deform the first and second meniscuses such that drying via the drying vapor occurs at substantially the same point above a surface of the fluid.

20. A substrate processing apparatus, comprising:
a mechanism for forming a meniscus on a surface of a substrate by moving the substrate through a fluid, wherein the mechanism further comprises:
a mechanism for moving a substrate through a fluid spray;
a fluid spray nozzle adapted to supply the fluid spray;
an air knife apparatus positioned to apply an air knife to shorten the meniscus formed on the surface of the substrate; and
a drying vapor nozzle positioned to direct a drying vapor to the meniscus shortened by the air knife.

* * * * *